(12) United States Patent
Horiike et al.

(10) Patent No.: US 10,457,828 B2
(45) Date of Patent: Oct. 29, 2019

(54) LAMINATE AND GAS BARRIER FILM

(71) Applicant: Toppan Printing Co., Ltd., Taito-ku, Tokyo (JP)

(72) Inventors: Takahumi Horiike, Taito-ku (JP); Jin Sato, Taito-ku (JP); Nao Takashima, Taito-ku (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 14/862,283

(22) Filed: Sep. 23, 2015

(65) Prior Publication Data
US 2016/0009942 A1    Jan. 14, 2016

Related U.S. Application Data

(63) Continuation of application No. PCT/JP2014/057550, filed on Mar. 19, 2014.

(30) Foreign Application Priority Data

Mar. 27, 2013   (JP) .................................. 2013-066166

(51) Int. Cl.
*C09D 133/10*   (2006.01)
*C23C 16/455*   (2006.01)
(Continued)

(52) U.S. Cl.
CPC .............. *C09D 133/10* (2013.01); *B32B 9/00* (2013.01); *B32B 27/06* (2013.01); *C09D 1/00* (2013.01);
(Continued)

(58) Field of Classification Search
CPC ...... C09D 133/10; C09D 1/00; C23C 16/405; C23C 16/403; C23C 16/45525;
(Continued)

(56) References Cited

U.S. PATENT DOCUMENTS 6,146,225 A     11/2000   Sheats et al.
6,602,564 B1 *   8/2003   Komori ................... C08J 7/045
                                                        428/213

(Continued)

FOREIGN PATENT DOCUMENTS

EP     1563989 A1 *   8/2005   .............. C08J 7/045
JP     2000-127300       9/2000
(Continued)

OTHER PUBLICATIONS

International Search Report issued in International Patent Application No. PCT/JP2014/057550 dated Jun. 3, 2014.
(Continued)

*Primary Examiner* — Frank J Vineis
*Assistant Examiner* — Michael Zhang
(74) *Attorney, Agent, or Firm* — Foley & Lardner LLP

(57) ABSTRACT

A laminate includes a base having a surface; an atomic layer deposition film that covers the surface of the base and has a film thickness of about 3 nm to about 500 nm (inclusive); and an overcoat layer that covers the atomic layer deposition film. A relationship of $t_a < t_{oc} < 50\, t_a$ is met, where $t_a$ denotes the thickness of the atomic layer deposition film and $t_{oc}$ denotes the thickness of the overcoat layer.

9 Claims, 1 Drawing Sheet

(51) Int. Cl.
*C23C 16/40* (2006.01)
*C09D 1/00* (2006.01)
*B32B 9/00* (2006.01)
*B32B 27/06* (2006.01)

(52) U.S. Cl.
CPC ............ *C23C 16/40* (2013.01); *C23C 16/403* (2013.01); *C23C 16/405* (2013.01); *C23C 16/45525* (2013.01); *C23C 16/45555* (2013.01); *B32B 2307/7242* (2013.01); *B32B 2439/00* (2013.01); *B32B 2439/70* (2013.01); *B32B 2439/80* (2013.01); *B32B 2457/14* (2013.01); *B32B 2457/20* (2013.01)

(58) Field of Classification Search
CPC ... C23C 16/45555; C23C 16/40; B32B 27/06; B32B 9/00; B32B 2457/20; B32B 2457/14; B32B 2439/00; B32B 2439/70; B32B 2307/7242; B32B 2439/80
See application file for complete search history.

(56) References Cited

U.S. PATENT DOCUMENTS

| | | | |
|---|---|---|---|
| 2003/0064607 A1* | 4/2003 | Leu | C23C 16/02 438/780 |
| 2003/0203210 A1 | 10/2003 | Graff et al. | |
| 2005/0214530 A1* | 9/2005 | Tanaka | B32B 27/06 428/347 |
| 2008/0182101 A1* | 7/2008 | Carcia | C23C 16/403 428/332 |
| 2009/0191706 A1 | 7/2009 | Kubota | |
| 2011/0114992 A1 | 5/2011 | Schmid et al. | |
| 2013/0252002 A1* | 9/2013 | Suzuki | H05B 33/04 428/448 |

FOREIGN PATENT DOCUMENTS

| | | | | | |
|---|---|---|---|---|---|
| JP | 2005178137 A | * | 7/2005 | | |
| JP | 2007-090803 A | | 4/2007 | | |
| JP | 2009-052063 A | | 3/2009 | | |
| JP | 2011-173261 A | | 9/2011 | | |
| JP | 2011173261 A | * | 9/2011 | | |
| JP | 2012-096431 A | | 5/2012 | | |
| JP | 2012-096432 A | | 5/2012 | | |
| JP | WO 2012067230 A1 | * | 5/2012 | ............ | H05B 33/04 |
| WO | WO-2006014591 A2 | * | 2/2006 | ......... | C23C 16/0272 |
| WO | WO-2013/000797 A1 | | 1/2013 | | |
| WO | WO-2013/015417 A1 | | 1/2013 | | |

OTHER PUBLICATIONS

Extended European Search Report issued in European Patent Application No. 14775067.3 dated Sep. 30, 2016.
Japanese Office Action dated Dec. 5, 2017 in corresponding application No. 2015-508385.
Office Action issued in corresponding TW application No. 103110808 dated Aug. 10, 2017.

* cited by examiner

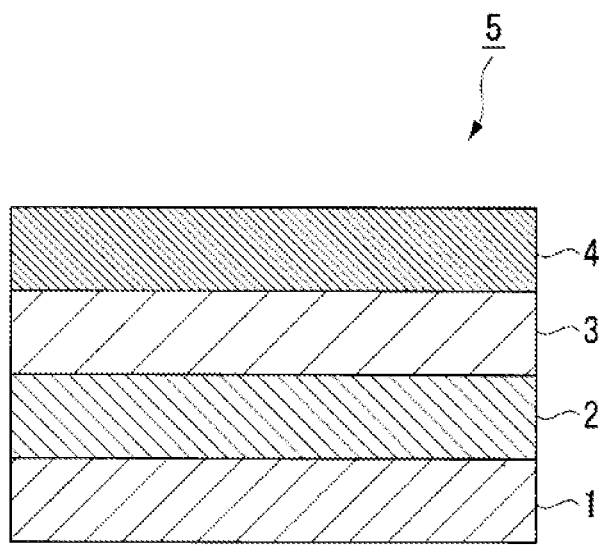

LAMINATE AND GAS BARRIER FILM

CROSS-REFERENCE TO RELATED PATENT APPLICATIONS

This application is a continuation application filed under 35 U.S.C. 111(a) claiming the benefit under 35 U.S.C. §§ 120 and 365(c) of PCT International Application No. PCT/JP2014/057550 filed on Mar. 19, 2014, which is based upon and claims the benefit of priority of Japanese Application No. 2013-066166 filed on Mar. 27, 2013, the entire contents of both of which are hereby incorporated by reference in their entireties.

BACKGROUND

The present invention relates to a laminate with an atomic layer deposition on an outer surface of a base, in which the atomic layer deposition is produced by an atomic layer deposition method, and a gas barrier film composed of the laminate.

Methods of creating a thin layer film on a substance by using a gas phase, where atoms or molecules of the substance can move like a gas, are generally categorized into Chemical Vapor Deposition (CVD) and Physical Vapor Deposition (PVD).

Two of the major PVD methods are vacuum deposition and sputtering methods. Of these methods, the apparatus for performing the sputtering method is generally higher in cost, but that apparatus produces high-quality thin films with an even film quality and an even film thickness. For that reason, these methods are used widely for display devices such as liquid crystal displays.

For the CVD method, raw material gases are introduced into the vacuum chamber, in which one or more than two kinds of gases are decomposed or reacted on a substrate through application of heat energy. This method may be combined with plasma or catalytic reactions in order to promote the film forming reaction or to decrease the reaction temperature which are necessary when the gases are decomposed or reacted with each other. These methods are called PECVD (Plasma enhanced CVD) and Cat-CVD, respectively. These CVD methods are advantageous in that defects caused in the formed films are few, and can be used in steps for manufacturing semiconductor devices, such as forming gate insulating films.

Meanwhile, in recent years, an atomic layer deposition (ALD method) has raised interest. This ALD method is a technique of forming films, layer by layer, at an atomic level, where substances are adsorbed on a surface to react chemically thereon, and is also classified as a CVD method. However, the ALD method is regarded as being different from the typical CVD method in that a generally used CVD method (i.e., the typical CVD method) uses a single type of gas or a plurality of types of gases together so as to react chemically on the substrate to form a thin film thereon. In contrast, the ALD method is a special film deposition method, where an active gas called a precursor and a reactive gas (this gas is also referred to as a precursor in the ALD method) are used alternately to grow a thin film layer by layer at the atomic level on the substrate, through absorption on the substrate surface and chemical reactions following the absorption.

The ALD method is practically described herein. In this method, an effect, which is known as a "self-limiting effect," is used, that is when the surface is covered by a certain type of gas during the surface absorption on the substrate, gas absorption will not occur any more. Firstly, the surface absorption is performed during which this effect is used to discharge the remaining non-reactive precursor gas when only one layer of the precursor has been adsorbed. The reactive gas is then introduced to enable the absorbed precursor to be oxidized or reduced so as to obtain only one thin film having a desired composition, following discharging the reactive gas. These processes are provided as one cycle and this cycle is repeated to grow the thin film, thus enabling the film formation. Therefore, with the ALD method, the thin film can be grown two-dimensionally. In addition, this ALD method can provide a thin film with fewer defects, even compared to not only the traditional vacuum deposition and sputtering methods but also the common CVD method.

For this reason, the application of the ALD method is anticipated to be used widely in the packaging sector of food and pharmaceuticals, and the electronic device field.

In addition, there is also a method which is categorized into the ALD method. Though the ALD method includes a step in which the second precursor is degraded and reacted with the first precursor adhered to the substrate, herein the plasma method is used to activate the reaction. This method is called plasma activated ALD (PEALD: Plasma Enhanced ALD) or simply Plasma ALD.

The ALD technique was first proposed by Dr. Tuomo Sumtola of Finland in 1974. Generally the ALD method is able to provide high quality and high density film formation, so the ALD method has therefore been used in the semiconductor field, such as for gate electrode production. This ALD method has also been reported in ITRS (International Technology Roadmap for Semiconductors). Furthermore, compared to other deposition methods, the ALD method has less influence from the oblique shadow effect (which is a phenomenon where sputtering particles enter the surface of the substrate obliquely, causing non-uniformness of the film deposition). Therefore, in the ALD method, the film deposition is possible as long as there is a gap for the gas into the substrate. For this reason, the ALD method is expected to be applied for coating lines and holes of substrates, where the lines and holes have a higher aspect ratio, that is, a higher ratio between the depth and the width, and also to coating three-dimensional structures in MEMS (Micro Electro Mechanical Systems) related systems.

In contrast, demerits of using ALD method are that special materials are necessary and therefore the overall cost is high. In such conditions, the biggest demerit is that it is slower in forming films. For example, compared to the usual vacuum deposition or sputtering method, the film formation speed is 5-10 times slower with the ALD method.

There are a variety of objects in which thin films are formed using the ALD method, they include, small plate-shaped substrates such as wafers and photomasks; larger-area, but non-flexible substrates such as glass plates, or large-area and flexible substrates such as films. There are equipped mass production facilities in which thin films are produced on substrates depending on their applications. In such facilities, various substrate handing techniques have been proposed and put into practical use, from the cost point of view, handling simplicity, and film formation quality, etc.

For mass production apparatuses for thin film deposition on a substrate, there are several types of film deposition apparatuses known. One is a batch type film deposition apparatus, in which a single substrate is supplied as a wafer in a film deposition machine for the film deposition, and then the substrate is replaced by the next substrate for the next film deposition or a plurality of substrates are set at the same time to carry out the same film deposition on the all the wafers.

Another type of the mass production apparatus is exemplified as an inline type film apparatus which forms a film on members such as a glass substrate. In this apparatus, the substrate is conveyed in sequence relative to a source of film formation, during which time film deposition is carried out in parallel with the conveyance. Other types of apparatuses include a coating film formation apparatus which is called a film formation roll to roll coater. In this coater, flexible substrates are un-wound and whilst conveyed the film is formed, and thereafter, wound on to another roll. As the coating film formation apparatus, there can also be provided a web coating film formation apparatus directed to not only for flexible substrates, but also flexible sheets that can continuously convey substrates for film deposition or a partly flexible tray that can convey substrates for continuous film deposition.

For either a film deposition method using the film deposition apparatus and the technique used to process the substrate, deposition apparatuses are combined so as to obtain the ultimate deposition speed, in addition to the consideration of various factors such as the cost, quality and easy processing.

Furthermore, there has been known a technique related to the ALD method (as shown in patent literature 1, for example). This technique discloses deposition of a barrier layer on the surface of a plastic film by performing atomic layer vapor deposition based on the ALD method. In the technique disclosed by the patent literature 1, the atomic layer vapor deposition is performed based on the ALD method so that there can be provided barrier films of higher barrier performance.

RELATED ART LITERATURE

Patent Literature

[PTL 1] JP-A-2012-096432

SUMMARY OF THE INVENTION

As described earlier, laminates each having an atomic layer deposition film formed on the outer surface of a base using the ALD method, are known widely. These laminates are used as gas barrier films because of their higher gas barrier performance. However, the atomic layer deposition film is scratched easily through external forces. When the atomic layer composited layer is scratched due to through external forces, there are cases where the scratching results in the forming of a through-hole extending in the layer thickness direction of the atomic layer deposition, which is dependent on the size of the scratch. When such a through-hole thus occurs in the layer thickness direction of the atomic layer deposition, a gas may penetrate to and from the base via the through-hole, thus degrading the gas barrier performance of the laminate.

There is another problem that may arise, when a film-shaped gas barrier film is produced which uses a laminate with such an atomic layer deposition film which is easily scratched. That is, the manufacturing line must be built such that the atomic layer deposition must not make contact with a rigid body once the atomic layer deposited layer has been formed, as this will cause a decrease in gas barrier performance. For this reason, in manufacturing laminated gas barrier films using the laminate, rolling up the gas barrier film into rolls may give rise to a decrease in the gas barrier film performance. Therefore, not being able to convey or keep the gas barrier film in the form of rolls is problematic.

The present invention has been made in the consideration of the foregoing reasons, and an object of the present invention is to provide a laminate with increased gas barrier performance whereby preventing the atomic layer deposition film formed on the outer surface of the base, from being scratched easily, and a gas barrier film formed using this laminate.

In order to accomplish the object, a laminate according to a first aspect of the present invention is configured in such that the laminate includes a base with a surface; an atomic layer deposition film that covers the surface of the base and has a film thickness of 3 nm to 500 nm (inclusive); and an overcoat layer that covers the atomic layer deposition film, wherein a relationship of $t_a < t_{oc} < 50\ t_a$ is met, where to denotes the thickness of the atomic layer deposition film and toc denotes a thickness of the overcoat layer.

Preferably, the overcoat layer consists of water-soluble polymer and metal alkoxide.

Preferably, the overcoat layer preferably consist of any one of an oxide matter, nitride matter and oxynitride matter, all of which contain at least one selected from a group of elements consisting of Si, Al and Ti.

It is preferable, for the overcoat layer to be made using either a wet coating technique or a dry coating technique.

A second aspect of the present invention is provided as a gas barrier film, wherein the laminate is shaped into a film.

According to the foregoing aspects of the present invention, the overcoat layer is formed on the outer surface of the atomic layer deposition film which covers the base, which prevents an atomic layer deposition film from being scratched easily by external forces. In other words, this can lower the probability of forming an opening in the layer thickness direction of the atomic layer deposition film, where gas can enter to or leak from the atomic layer deposition film via the opening. A higher gas barrier film performance of both the laminate and articles formed from the laminate can therefore be better maintained, and a decrease in the gas barrier performance due to external forces is also lowered or prevented.

BRIEF DESCRIPTION OF THE DRAWINGS

FIG. 1 is a cross sectional view showing the configuration of a laminate according to an embodiment of the present invention.

DETAILED DESCRIPTION

A representative embodiment of the present invention will now be described. FIG. 1 is a cross sectional view illustrating the structure of a laminate exemplified in the embodiment of the present invention. As shown in FIG. 1, there is provided a laminate 5 which includes a base 1, an undercoat layer 2 (abbreviated as a "UC layer" hereafter) formed on one (front surface) of both outer surfaces of the base 1, an atomic layer deposition film 3 (abbreviated as an "ALD film" hereafter) formed on the surface of the UC layer 2, and an overcoat layer 4 (abbreviated as an "OC layer" hereafter) which covers the ALD film 3.

The base 1 is made from polymer materials. The polymer materials which can be used are for example, polyethylene (PE), polypropylene (PP), polyethylene (PS) polyethylene terephthalate (PET), nylon, or polyethersulfone.

When the laminate 5 is used as a gas barrier film, the thickness of the base 1 is set considering both a suitable packing performance required by packing materials for precision parts, electronic parts such as electroluminescent devices and an optimum processing condition required by a gas barrier film.

The UC layer 2 is provided to prevent an opening from occurring in the ALD film 3 through which gas can penetrate in the film thickness direction of the ALD film via the opening. For such prevention, the UC layer 2 highly densifies the atomic layer deposition film 3. To highly densify the ALD film 3, the ALD source material, the precursor, should be dispersed at a high density of adherence sites on the face of the ALD film 3 where the atomic layer is formed, and the atomic layer growth must be close to two-dimensional growth. Therefore if a highly dense polymer material or precursor which is able to densify the ALD film 3 is used as the base for the ALD described above, the UC layer 2 does not always have to be arranged. In other words, the laminate can be structured by the base 1, the ALD film 3 formed on the surface of the base 1, and the OC layer 4 which covers the ALD film 3.

When the UC layer 2 is formed, the UC layer 2 can contain inorganic substances, or can be formed containing organic macromolecules having a functional group in which the precursor of the ALD film 3 can be bound easily.

When the UC layer 2 contains inorganic substances, the precursor which is the source material of the ALD film 3, will be bound to the inorganic substances exposed on the surface layer of the UC layer 2. This binding produces a two-dimensional ALD film 3 which grows in a planar direction on the surface of the UC layer 2. As a result, an opening, through which gas penetrates in the laminate in the film thickness direction thereof, will be difficult to occur, thus providing the laminate with a higher gas barrier performance.

Meanwhile, when the UC layer 2 contains organic polymers, the organic polymers have a functional group that can easily be bound with the precursor of the ALD film 3. Hence, the precursors bound with each function group will also be bound together. This will produce a two-dimensional ALD film 3 that grows in a plane direction on the UC layer 2. As a result, an opening, through which gas penetrates in the laminate in the film thickness direction thereof, will be more difficult to occur, thus providing the laminate with a higher gas barrier performance.

The ALD film 3 is formed by using the ALD method. The ALD film 3 can be an inorganic oxide film made of a material such as $AlO_x$, $TiO_x$, $SiO_x$, $ZnO_x$, or $SnO_x$; a nitride film or an oxynitride film made of one of these inorganic substances; or an oxide film, a nitride film, or an oxynitride film made with other elements. In addition, the ALD film 3 may be a mixed film made of a combination of the foregoing films or elements.

It is preferable that the ALD film 3 has a thickness of 3 nm to 500 nm (exclusive), and it is particularly preferable that the thickness is 3 nm to 100 nm (exclusive). If the ALD film 3 has a film thickness smaller than 3 nm, the gas barrier layer function will be insufficient. In contrast, if ALD film 3 has a thickness larger than 500 nm, cracks can easily be formed, or optical properties will be difficult to regulate.

The ALD film 3 formed on the surface of the UC layer 2 has a greater barrier performance. Whereas, since the ALD layer 3 is relatively thinner, the ALD film 3 is likely to be scratched or to cause pinholes due to contacts between bases or other factors caused during the rolling up operation. If this happens, it can be the cause of a decrease in the gas barrier performance of the laminate.

Hence, in order to prevent the ALD film 3 from being damaged, such as being scratched, or from causing pinholes through contact between bases during the rolling-up operation for example, the OC layer 4 is formed as a protective layer on the surface of the ALD film 3.

In this layer structure, when the thickness of the ALD film 3 is denoted as $t_a$ and the thickness of the formed OC layer 4 is denoted as $t_{oc}$, it is preferred that the thickness of the OC layer 4 is set to meet a relationship of $t_a<t_{oc}<50\ t_a$, and preferably, a relationship of $t_a<t_{oc}\leq 10\ t_a$ is met. If the thickness $t_{oc}$ of the OC layer 4 is equal to or less than the thickness $t_a$, a crack caused by external factors, may easily reach the ALD film 3, and therefore the OC layer is unable to completely function as a protective layer. On the other hand, if the thickness toc of the OC layer 4 is over the thickness $50 \cdot t_a$, it is considered that a crack could occur due to internal stress, and therefore the gas barrier performance in turn decrease. Here the thickness $t_a$ of the ALD film 3 and the thickness $t_{oc}$ of the OC layer 4 are expressed in nanometer scale.

As long as the foregoing relationships are met, the OC layer 4 can be composed of any material (organic material or inorganic material). The OC layer may be produced by a producing method based on a wet coating technique or a dry coating technique.

It is preferred that the OC layer 4 is made of any one selected among oxide material, nitride materials, and oxynitride materials, each material being composed of water-soluble macromolecules and alkoxide metals, or each material containing at least one element selected from a group of Si, Al and Ti.

For the OC layer 4 composed of the water-soluble macromolecules and the alkoxide metals, the OC layer 4 is produced by using the water-soluble macromolecules and a coating agent where the base compound is water solution containing one or more types of alkoxide metal or its hydrolysate, or a mixed solution of water and alcohol.

Specifically, for example, a mixed solution is prepared by dissolving a water-soluble macromolecule in an aqueous solvent, and by directly mixing an alkoxide metal with the solvent, or with the solvent after being processed by hydrolysis or others. The surface of the ALD film 3 is then coated with the mixed solution, and subjected to heat-drying, thereby forming the OC layer 4. Since the OC layer 4 is made of water-soluble macromolecules and alkoxide metals, the gas barrier performance and steam barrier performance can be improved.

The water-soluble macromolecules used for the coating agent are polyvinyl alcohol, polyvinylpyrrolidone, starch, methyl cellulose, carboxy methyl cellulose, and sodium alginate etc. Especially when polyvinyl alcohol (abbreviated as PVA hereafter) is used as a coating agent, the gas barrier performance is highly superior and is therefore favorable. The PVA named here is normally derived by saponification of polyacetate vinyl. As a PVA, for example, the acetate base contained is a few 10%, and from so called partial saponification PVA where only a few % of the acetate base is contained to a complete PVA can be utilized, and other PVAs can also be used.

The alkoxide metal is a compound which can be expressed by a general molecular equation of M(OR)n (M: a metal such as Si, Ti, Al or Zr, and R: an alkyl group such as $CH_3$ or $C_2H_5$). Specifically, tetraethoxysilane [$Si(OC_2H_5)_4$], and aluminum triisopropoxide [$Al(O-i-C_3H_7)_3$] etc. are examples. Out of these compounds, tetraethoxysilane and the aluminum triisopropoxide are reasonably stable in aqueous solutions after being processed by hydrolysis, so they are preferable.

As the coating method for coating agents, a known typically-used wet coating technique can be adopted in the present embodiment. For example, the dipping method, roll coating method, screen printing method, and the spray method etc. can be used. In particular, among such coating techniques, a coating method that will avoid contact with the ALD film 3 layer is preferable.

Furthermore, when the OC layer 4 is made of an oxide material, a nitride material or an oxynitride material, each containing at least one element selected from a group of Si, Al and Ti, it is preferred that, by way of example, the OC layer is produced as any one of i) an oxide film consisting of one of $SiO_x$, $AlO_x$, or $TiO_x$; ii) a nitride film or an oxynitride film, each containing one of the above elements; iii) an inorganic oxide film, an inorganic nitride film, an inorganic oxynitride film, or a mixed inorganic film made by mixing thereof, each containing one of the foregoing above elements and another element such as Sn, Ta, or Zr. When the OC layer 4 is composed of such an inorganic film, the durability is improved and the barrier resistance is improved as well.

As the source gas used to deposit such an inorganic film, it is preferred to use tris(dimethylamino)silane ($SiH[N(CH_3)_2]_3$), trimethylaluminum (TMA) or titanium-tetrachloride (TiCl4) for example, however it is not limited to use such a material.

The inorganic film composing the OC layer 4 is formed using dry-coating methods. For example it is favorable to deposit the layer using either the PVD or the CVD method.

The PVD method can be exemplified as a resistant heat method, an electronic beam deposition method or a sputtering method. For the CVD method, a heat CVD method, a photo-CVD method, and a plasma-CVD method can be adopted as a preferable CVD technique.

In rolling up the laminate provided with the OC layer 4 according to the above, the ALD film 3 will not make direct contact with any other base material. That is, if the ALD film composes the outermost surface, there is much less or almost no possibility of a through-hole is being formed, even when an external force with the sufficient strength to cause a through-hole in the film thickness direction is applied. The reason for this is that the OC layer 4 is formed as the outermost layer of the laminate. Providing the OC layer 4 on the surface of the ALD film 3 accordingly, in turn provides the laminate with a greater gas barrier performance.

In the present embodiment, the thickness of the OC layer 4 is not restricted to a particular value, as long as the relationship (i.e., $t_a < t_{oc} < 50\ t_a$) between the thicknesses of the OC layer 4 and the ALD film is satisfied. From this point of view, by way of example, it is preferable to be based on various ranges which maintains a relationship of 3 nm $< t_{oc} <$ 400 nm.

As described, the laminate 1 is composed of the base 1, the UC layer 2, the ALD film 3 and the OC layer 4 (however, of these layers, the UC layer 2 is optionally employed). Since the OC layer 4 is formed on the ALD film 3, scratches through external forces will be difficult to occur. Specifically the possibility of causing a scratch where a gas enters and leaves the film thickness direction of the ALD film 3 will be decreased. Therefore, the laminate created in the form of a film can be used as a gas barrier film.

EXAMPLES

Next, Examples of the laminate provided with the OC layer 4 produced based on the foregoing embodiment will be described. In the following, a method of depositing a gas barrier film composed of the ALD film 3 will be described.

[Film deposition of Atomic Layer Deposition Film 3 ($Al_2O_3$)]

Firstly, an $Al_2O_3$ film was formed on the top of the UC layer. The UC layer was formed on the surface of the polyethylene terephthalate (abbreviated as PET film hereafter) which is the film forming polymer material at a thickness of 100 μm, using the ALD method. At this point, the trimethyl aluminum (TMA) was used as the source gas. Additionally, $O_2$ and $N_2$ as a process gas, $O_2$ and $N_2$ as the purging gas and $O_2$ as the reactant gas and plasma discharge gas, were each delivered to the deposition chamber simultaneous with the source gas. At this stage the process capacity (the pressure of the deposition chamber at the time of film formation) was 10-50 Pa. Furthermore, excitation supply an electric power supply of 13.56 MHz was applied, and by using the ICP (Inductively Couple Plasma) mode plasma discharge performed.

Also, the TMA and the process gas supply time was 60 sec, purge gas supply time 10 sec, and the reactant gas and plasma discharge gas were both supplied for 10 sec. With the discharge of both reactant gas, the plasma discharge was simultaneously generated from the ICP mode. At this point, the power output of the plasma discharge was 250 watt. Also, after the plasma discharge, as the purge gas $O_2$ and $N_2$ was supplied for 10 sec. Here, the deposition chamber was used at 90° C.

When applying the conditions described above the deposition speed of $Al_2O_3$ was as follows. That is, as the deposition speed unit is approximately 1.4 Å/cycle, when 140 cycles of deposition process are performed with a deposition film thickness of approximately 20 nm, the deposition total time was 84 min.

[Film Deposition of Atomic Layer Deposition Film $TiO_2$]

Firstly, a $TiO_2$ film is formed on the top of the UC layer, which is formed on the surface of PET film, film-type polymer material with a film thickness of 100 μm using the ALD method. At this time, titanium tetra-chloride ($TiCl_4$) was used as the source gas. Also, as the process gas $N_2$, as the purge gas $O_2$ and $N_2$, and the both the reactant gas and plasma discharge gas $O_2$, respectively was supplied in the deposition chamber, simultaneously with the source gas.

The supply time for each gas was, for the $TiCl_4$ and process gas 1 sec., for the purge gas 60 sec., and for both reactant gas and discharge gas 5 sec. Also, with supply of both the reactant gas and discharge gas, the plasma discharge was generated from the ICP mode simultaneously. At this time the output power of the plasma discharge was 250 watt. Thereafter, the purge gas $O_2$ and $N_2$ were supplied for 4 sec following the plasma discharge. At this time, the deposition temperature was set at 90° C.

When using the conditions described above, the deposition speed of $TiO_2$ is described. That is, as the deposition speed in units is approximately 1.1 Å/cycle, and when 176 cycles of deposition process are performed with a deposition film thickness of approximately 20 nm, the deposition total time was 253 min.

[The Laminate Water Vapor Permeability]

Next based on the embodiments above, the experimental results of the water vapor permeability rate (hereafter abbreviated WVTR) of the materialized laminate with an OC layer 4, before and after the laminate makes contact with the roller and is wound-up and stored, will be described using several examples. The water vapor permeability measuring rate was measured using a water vapor permeability device, MOCON Aquatran (registered trademark) or MOCON PER- MATRAN (registered trademark) set at 40° C./90% RH atmosphere. The FIGURE shows the comparative WVRT of the laminate before and after winding. Each example will be described using Table 1.

TABLE 1

| Sample No. | Base Material | Undercoat Layer | Barrier Layer | Overcoat Layer | WVTR (g/m²/day) Before Winding | WVTR (g/m²/day) After Winding |
|---|---|---|---|---|---|---|
| Example1-1 | PET | 0.34 µm | $Al_2O_3$ | Wet Coating | $2.4 \times 10^{-3}$ | $3.3 \times 10^{-3}$ |
| Example1-2 | (100 µm) |  | $TiO_2$ | (50 nm) | $2.0 \times 10^{-3}$ | $3.1 \times 10^{-3}$ |
| Example2-1 |  |  | $Al_2O_3$ | Dry Coating | $2.9 \times 10^{-3}$ | $3.0 \times 10^{-3}$ |
| Example2-2 |  |  | $TiO_2$ | (100 nm) | $2.7 \times 10^{-3}$ | $2.9 \times 10^{-3}$ |
| Comp EX 1-1 |  |  | $Al_2O_3$ | — | $4.0 \times 10^{-3}$ | $1.4 \times 10^{-1}$ |
| Comp EX 1-2 |  |  | $TiO_2$ | — | $3.6 \times 10^{-3}$ | $2.0 \times 10^{-1}$ |
| Comp EX 2-1 |  |  | $Al_2O_3$ | Dry Coating | $5.0 \times 10^{-3}$ | $9.7 \times 10^{-1}$ |
| Comp EX 2-2 |  |  | $TiO_2$ | (10 nm) | $6.0 \times 10^{-3}$ | $1.0 \times 10^{-1}$ |
| Comp EX 3-1 |  |  | $Al_2O_3$ | Wet Coating | $5.5 \times 10^{-3}$ | $1.1 \times 10^{-1}$ |
| Comp EX 3-2 |  |  | $TiO_2$ | (1100 nm) | $5.0 \times 10^{-3}$ | $1.2 \times 10^{-1}$ |

Comp EX = Comparative Example

With the reference to Table 1, each example will now be described.

Example 1-1

In example 1-1, the surface of a PET film material with a thickness of 100 µm thickness relationship, coated with an organic solution containing polymethacrylate ester at a thickness to form a layer thickness of 0.34 µM after heat drying. The undercoat (UC) formed through heat drying, and an $Al_2O_3$ barrier film with a thickness of 20 nm (ALD film), and an over coat (OC) layer were layered respectively to form a laminated sample. The laminated sample was used to determine the gas barrier performance. The OC layer in this example was made with an aqueous solution containing water soluble macromolecules and alkoxide metals using the wet-coating method. This was performed by coating the surface of the barrier layer to become a thickness of 50 nm after heat drying, after the wet coating it was heat dried. The WVTR measured value of the sample described in this example was $2.4 \times 10^{-3}$ [g/m²/day] before winding and $3.3 \times 10^{-3}$ after winding.

Example 1-2

In the example 1-2, the surface of a PET film material with a thickness of 100 µm was coated with the UC layer formed according to the method described in example 1-1, a TiO2 barrier layer with a thickness of 20 nm, an OC layer with a film thickness of approximately 50 nm, formed using the method described in example 1-1, after which the produced laminated sample layered in this respective order was used to determine the gas barrier performance. The WVTR measured value of the sample (made) described in this example was $2.0 \times 10^{-3}$ [g/m²/day] before winding and $3.1 \times 10^{-3}$ after winding.

Example 2-1

In the example 2-1, the surface of a PET film material with a thickness of 100 µm was coated with the UC layer, which was formed using the method described in example 1-1, an Al2O3 barrier layer deposited at a film thickness of 20 nm, and an OC layer with a film thickness of 100 nm, after which the produced laminated sample layered in this respective order was used to determine the gas barrier performance. In this example, the OC layer was applied using the dry coating method formed by depositing a $SiO_2$ film. The WVTR measured value of the sample described in this example was $2.9 \times 10^{-3}$ [g/m²/day] before winding and $3.0 \times 10^{-3}$ after winding.

Example 2-2

In example 2-2, the surface of a PET film material with a thickness of 100 µm was coated with the UC layer formed using the method described in example 1-1, a TiO2 barrier layer with a thickness of 20 nm, and an OC layer with a film thickness of 100 nm, formed using the method described in Example 1-1, after which the produced laminated sample layered in this respective order was used to determine the gas barrier performance. The WVTR measured value of the sample (made) described in this example was $2.7 \times 10^{-3}$ [g/m²/day] before winding and $2.9 \times 10^{-3}$ after winding.

Comparative Examples

Next, the comparative examples will be described with reference to Table 1.

Comparative Example 1-1

In the comparative example 1-1, the surface of a PET film material with a thickness of 100 µm was coated with the UC layer formed using the method described in example 1-1, and an Al2O3 barrier layer with a film thickness of 20 nm, after which the produced laminated sample layered in this respective order was used to determine the gas barrier performance. In the comparative example 1-1, the OC layer 4 is not employed. The WVTR measured value of the sample in comparative example-1 was $4.0 \times 10^{-3}$ [g/m²/day] before winding and $1.4 \times 10^{-1}$ after winding.

Comparative Example 1-2

In comparative example 1-2, the surface of a PET film material with a thickness of 100 µm was coated with the UC layer formed using the method described in example 1-1, and a TiO2 barrier layer with a thickness of 20 nm, after which the produced laminated sample layered in this respective order was used to determine the gas barrier performance. Note; in the comparative Example 1-2 and as like with the comparative example 1-1, the OC 4 layer is not laminated. The WVTR measured value of the sample made in comparative example-1-2 was $3.6 \times 10^{-3}$ [g/m²/day] before winding and $2.0 \times 10^{-1}$ [g/m²/day] after winding.

Comparative Example 2-1

In comparative example 2-1 the surface of a PET film material with a thickness of 100 μm was coated with the UC layer formed using the method described in example 1-1, an $Al_2O_3$ barrier layer with a film thickness of 20 nm, and an OC layer with a film thickness of 10 nm, after which the produced laminated sample layered in this respective order was used to measure the gas barrier performance. In this example the OC layer was applied using the dry coating method, formed by depositing a $SiO_2$ film. In comparative example 2-1, if the film thickness of the barrier layer is written as $t_a$, the thickness of the OC layer 4 written as $t_{oc}$, then the film thickness of the OC layer 4, is thinner than the range that satisfies the relationship of $t_a < t_{oc} < 50\ t_a$. The WVTR measured value of the sample made in comparative example-1-2 was $5.0 \times 10^{-3}$ [g/m²/day] before winding and $9.7 \times 10^{-1}$ [g/m²/day] after winding.

Comparative Example 2-2

In comparative example 2-2 the surface of a PET film material with a thickness of 100 μm was coated with the UC layer formed using the method described in example 1-1, a $TiO_2$ barrier layer with a film thickness of 20 nm, and an OC layer with a film thickness of 10 nm, formed using the method described in Example 1-1, after which the produced laminated sample layered in this respective order was used to measure the gas barrier performance. The WVTR measured value of the sample made in comparative example-2-2 was $6.0 \times 10^{-3}$ [g/m²/day] before winding and $1.0 \times 10^{-1}$ [g/m²/day] after winding.

Comparative Example 3-1

In comparative example 3-1, the surface of a PET film material with a thickness of 100 μm was coated with the UC layer formed using the method described in example 1-1, and an $Al_2O_3$ barrier layer with a film thickness of 20 nm, and an OC layer 4 film, with a film thickness of 1100 nm formed using the method described in example 1-1, after which the produced laminated sample layered in this respective order was used to measure the gas barrier performance. If the film thickness of the barrier layer is written $t_a$, and the OC layer film thickness $t_{oc}$, in the comparative layer 3-1 the OC layer 4 film thickness is thicker than the range that satisfies the relationship of $t_a < t_{oc} < 50\ t_a$. The WVTR measured value of the sample made in comparative example 3-1 was $5.0 \times 10^{-3}$ [g/m²/day] before winding and $1.1 \times 10^{-1}$ [g/m²/day] after winding.

Comparative Example 3-2

In comparative example 3-2, the surface of a PET film material with a thickness of 100 μm was coated with the UC layer formed using the method described in example 1-1, the TiO2 barrier layer with a film thickness of 20 nm, and an OC layer 4 with a film thickness of 1100 nm, formed using the method described in Example 3-1, after which the produced laminated sample layered in this respective order was used to measure the gas barrier performance. The WVTR measured value of the sample made in comparative example 3-2 was $5.0 \times 10^{-3}$ [g/m²/day] before winding and $1.2 \times 10^{-1}$ [g/m²/day] after winding.

SUMMARY

As described above, it was confirmed that the barrier performance of a laminate with an OC layer is higher. Therefore, the laminate presented here within, by providing an OC layer on the surface of the ALD film (barrier layer), there will has almost no or few effects from stress and mechanical external forces from environmental changes etc., and the laminate gas barrier will have a higher performance.

From the above, an example of the laminate described in this embodiment was described with reference to the diagram, however the concrete structure is not limited to the examples described above. Also, from the embodiment described above, this embodiment is a materialized laminate that can also be provided as a gas barrier film in the film form.

THE APPLICABILITY IN INDUSTRY

The laminate according to the present invention can be used not only for electric parts e.g. electroluminescent device (EL device), liquid crystal TV displays, semiconductor wafers etc., but also valid for use in the pharmaceutical and food packaging films, and packaging of precision parts.

REFERENCE SIGNS LIST

1 Base
2 Undercoat layer (UC layer)
3 Atomic layer deposition film (ALD film)
4 Overcoat layer (OC layer)
5 Laminate

What is claimed is:
1. A laminate comprising:
a base with an undercoat layer;
an atomic layer deposition film that covers at least a portion of the undercoat layer and has a film thickness of about 3 nm to about 500 nm; and
an overcoat layer that covers the atomic layer deposition film,
wherein,
wherein the base comprises polyethylene terephthalate (PET) having a thickness of about 100 μm;
the undercoat layer comprises polymethacrylate ester having a thickness of about 0.34 μm;
wherein a relationship of $2.5\ t_a \leq t_{oc} \leq 50\ t_a$ is met, where to denotes the thickness of the atomic layer deposition film and toc denotes a thickness of the overcoat layer,
wherein the thickness of the overcoat layer is less than a thickness of the undercoat layer, and
wherein the atomic layer deposition film comprises $Al_2O_3$, wherein the overcoat layer is formed from an aqueous solution containing water soluble macromolecules and an alkoxide metal using a wet-coating technique.
2. A gas barrier film comprising the laminate of claim 1, wherein the laminate is shaped into a film.
3. The laminate of claim 1, wherein a relationship $2.5\ t_a \leq t_{oc} \leq 10\ t_a$ is met.
4. The laminate of claim 3, wherein the alkoxide metal is $M(OR)_n$, wherein M is Si, Ti, Al or Zr, and R is an alkyl group.
5. The laminate of claim 4, wherein R is $CH_3$ or $C_2H_5$.

6. The laminate of claim 4, wherein the alkoxide metal is tetraethoxysilane or aluminum triisopropoxide.

7. The laminate of claim 1, wherein the alkoxide metal is $M(OR)_n$, wherein M is Si, Ti, Al or Zr, and R is an alkyl group.

8. The laminate of claim 7, wherein R is $CH_3$ or $C_2H_5$.

9. The laminate of claim 7, wherein the alkoxide metal is tetraethoxysilane or aluminum triisopropoxide.

\* \* \* \* \*